United States Patent
Jung et al.

(10) Patent No.: US 11,830,908 B2
(45) Date of Patent: *Nov. 28, 2023

(54) RF SWITCH DEVICE HAVING A HIGHLY RESISTIVE SUBSTRATE, AN ISOLATION LAYER THEREIN OR THEREON, AND A TRAP-RICH LAYER THEREIN OR THEREON

(71) Applicant: DB HiTek Co., Ltd., Bucheon-si (KR)

(72) Inventors: Jin Hyo Jung, Suwon-si (KR); Hyun Jin Kim, Seoul (KR); Seung Ki Ko, Yongin-si (KR); Sang Gil Kim, Cheongju-si (KR); Tae Ryoong Park, Seoul (KR); Ki Hun Lee, Yangpyeong-gun (KR); Kyong Rok Kim, Bucheon-si (KR)

(73) Assignee: DB HiTek, Co., Ltd., Bucheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/569,382

(22) Filed: Jan. 5, 2022

(65) Prior Publication Data

US 2023/0057074 A1    Feb. 23, 2023

(30) Foreign Application Priority Data

Feb. 25, 2021 (KR) .................. 10-2021-0025370

(51) Int. Cl.
*H01L 29/06* (2006.01)
*H01L 27/085* (2006.01)
*H01L 21/265* (2006.01)
*H01L 21/266* (2006.01)

(52) U.S. Cl.
CPC ........ *H01L 29/0607* (2013.01); *H01L 21/266* (2013.01); *H01L 21/26506* (2013.01); *H01L 27/085* (2013.01)

(58) Field of Classification Search
CPC .......... H01L 29/0607; H01L 21/26506; H01L 21/266; H01L 27/085; H01L 21/762; H01L 21/823481; H01L 29/0649
USPC ........................................ 257/213
See application file for complete search history.

(56) References Cited

U.S. PATENT DOCUMENTS

| | | | | |
|---|---|---|---|---|
| 6,333,229 | B1 * | 12/2001 | Furukawa | ......... H01L 21/28114 257/E21.429 |
| 2003/0141549 | A1 * | 7/2003 | Miyano | ............ H01L 29/66628 257/E21.12 |
| 2009/0212335 | A1 * | 8/2009 | Kao | ................... H01L 27/1463 257/292 |
| 2010/0159632 | A1 * | 6/2010 | Rhodes | ............... H01L 27/1464 438/57 |
| 2013/0099324 | A1 * | 4/2013 | Huang | ................ H01L 29/2003 257/E21.445 |
| 2015/0206936 | A1 * | 7/2015 | Huang | ............. H01L 29/66568 438/162 |

(Continued)

FOREIGN PATENT DOCUMENTS

KR    10-2019-0127389 A    11/2019

*Primary Examiner* — Duy T Nguyen
(74) *Attorney, Agent, or Firm* — Andrew D. Fortney; Central California IP Group, P.C.

(57) ABSTRACT

An RF switch device and a method of manufacturing the same are proposed. A trap area is formed in or on a surface of a highly resistive substrate to trap carriers accumulating on the surface of the substrate, thus improving RF characteristics.

16 Claims, 16 Drawing Sheets

(56) References Cited

U.S. PATENT DOCUMENTS

2020/0295139 A1\* 9/2020 Sundaresan ......... H01L 29/7802
2021/0013343 A1\* 1/2021 Singh .................. H01L 21/3065

\* cited by examiner

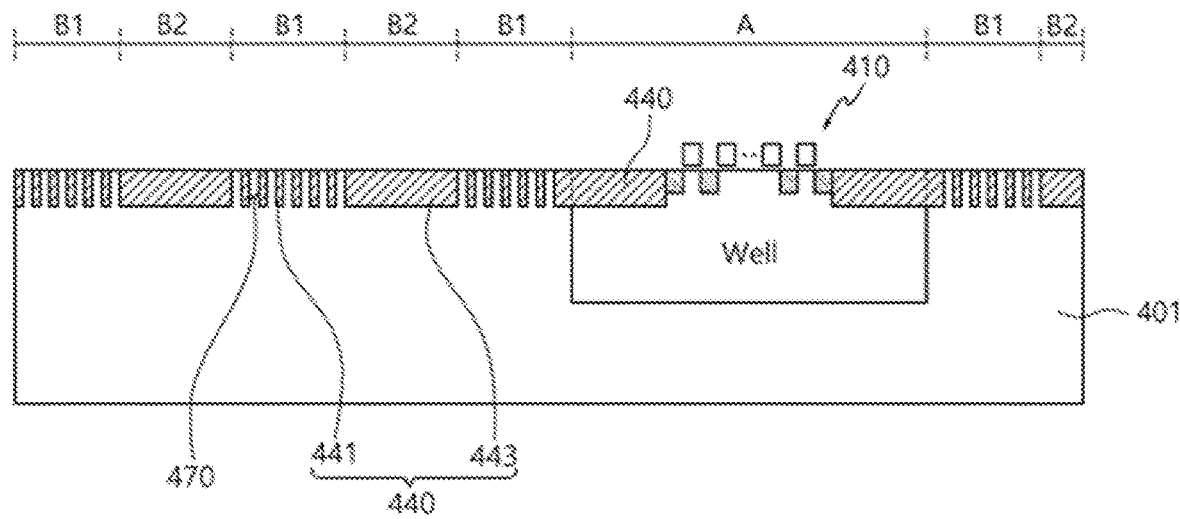
FIG.16
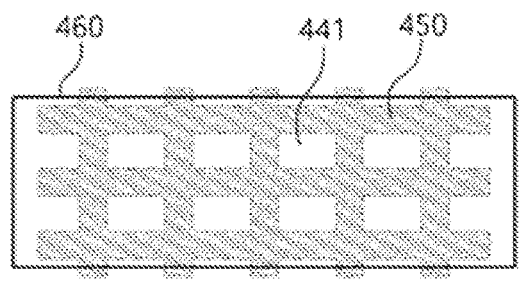
FIG. 17A
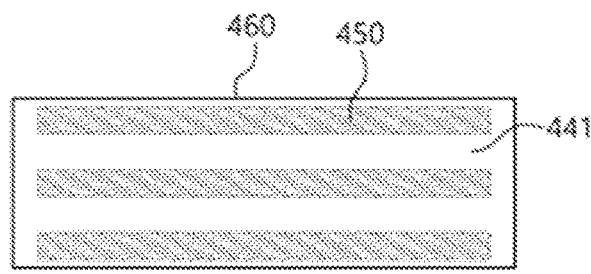
FIG. 17B
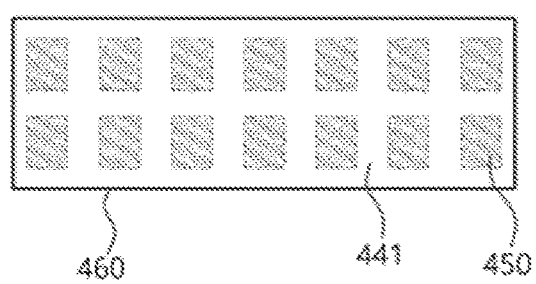
FIG. 17C
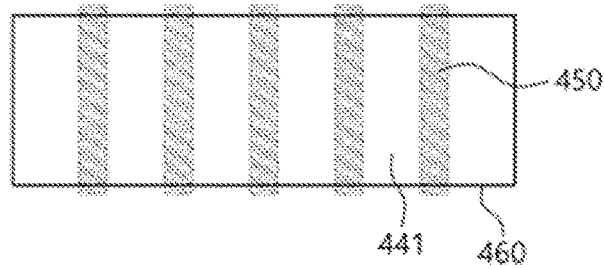

RF SWITCH DEVICE HAVING A HIGHLY RESISTIVE SUBSTRATE, AN ISOLATION LAYER THEREIN OR THEREON, AND A TRAP-RICH LAYER THEREIN OR THEREON

CROSS REFERENCE TO RELATED APPLICATION

The present application claims priority to Korean Patent Application No. 10-2021-0025370, filed Feb. 25, 2021, the entire contents of which are incorporated herein for all purposes by this reference.

BACKGROUND OF THE INVENTION

Field of the Invention

The present disclosure relates to an RF switch device and a method of manufacturing the same. More particularly, the present disclosure relates to an RF switch device and a method of manufacturing the same, having a trap area in a surface of a highly resistive substrate to trap a carrier on the surface of the substrate, thus improving RF characteristics.

Description of the Related Art

Generally, a Radio Frequency Front-End Module (RF FEM) is used in wireless communication devices such as a mobile phone, a smartphone, a laptop computer, a tablet PC, a PDA, a mobile game device, or a multimedia device may include an RF active device, an RF passive device, an RF switch device, and a control device.

FIG. 1 is a reference diagram of a conventional RF switch substrate, and FIG. 2 is a graph comparing HD2 characteristics of a general SOI wafer, an SOI wafer using a highly resistive substrate, and an SOI wafer having a trap-rich layer on the highly resistive substrate.

Hereinafter, the structure and problems of the conventional RF switch substrate 9 will be described in detail.

The conventional substrate 9 will be described with reference to FIG. 1: a buried oxide (BOX) layer 930 is stacked on a highly resistive substrate (HRS) 910, and subsequently a top silicon (Si) layer 950 is stacked on the BOX layer 930. The silicon layer 950 is physically separated from the highly resistive substrate 910 by the BOX layer 930. However, radio frequency coupling may occur due to parasitic capacitance between the highly resistive substrate 910 and the silicon layer 950, so a carrier (e.g., one or more charge carriers) may accumulate on a surface of the highly resistive substrate 910 at the interface with the BOX layer 930. Thereby, the surface resistance of the highly resistive substrate 910 decreases. This is referred to as Parasitic Surface Conduction (PSC). Due to the PSC phenomenon, crosstalk may occur between adjacent metal lines (e.g., above the silicon layer 950). Furthermore, the resistance level of the highly resistive substrate 910 may vary depending on an input radio frequency signal; that is, linearity may deteriorate.

In order to solve the problem, a structure for removing the PSC phenomenon by forming a trap-rich layer 970 between the BOX layer 930 and the highly resistive substrate 910 and then trapping the carrier(s) that occurs on the surface of the highly resistive substrate 910 is used. Thereby, improved RF characteristics may be obtained as compared to the conventional structure.

Referring to FIG. 2, reference character A denotes second harmonic distortion (HD2) characteristics of a general SOI wafer having a substrate resistance of 10 ohm·cm, reference character B denotes HD2 characteristics of an SOI wafer having a substrate resistance of 1,000 ohm·cm (a highly resistive substrate), and reference character C denotes HD2 characteristics of the SOI wafer having a trap-rich layer 970 on the highly resistive substrate. Assuming that the input power is 15 dBm, it can be seen that the highly resistive substrate 910 improves the HD2 characteristics by about 30 dB as compared to the general 501 wafer, and the trap-rich layer 970 further improves the HD2 characteristics by about 40 dB.

However, the trap-rich layer 970 between the BOX layer 930 and the highly resistive substrate 910 is problematic, in that it is formed by a relatively complicated process, its manufacturing cost is high, and thereby its economic efficiency is relatively low.

DOCUMENTS OF RELATED ART (Patent Document) KR 10-2019-0127389 'Semiconductor Device and Method of Manufacturing the Same'

SUMMARY OF THE INVENTION

Accordingly, the present disclosure has been made keeping in mind the above problems occurring in the related art, and an objective of the present disclosure is to provide an RF switch device and a method of manufacturing the same, in which a trap-rich layer is on a surface of a highly resistive substrate to trap one or more carriers on the surface of the substrate, thereby improving a PSC phenomenon.

Furthermore, an objective of the present disclosure is to provide an RF switch device and a method of manufacturing the same, in which a trap-rich layer is in the highly resistive substrate, thereby avoiding formation of the trap-rich layer between a BOX layer and the highly resistive substrate as in the related art, thus simplifying the manufacturing process and enhancing economic efficiency.

In order to achieve the objectives of the present disclosure, the present disclosure provides an RF switch device, including a highly resistive substrate having a well-forming area containing an active device (e.g., an array of active devices) and a well, and a peripheral area; a gate electrode on the highly resistive substrate in the well-forming area; a source and a drain in the highly resistive substrate in the well-forming area; an isolation layer in or on a surface of the highly resistive substrate in the well-forming area adjacent to a boundary with the peripheral area; and a trap-rich layer in or on the surface of the highly resistive substrate in the peripheral area.

The trap-rich layer, which may not be in the well-forming area, may comprise an area (e.g., of the highly resistive substrate) doped with Group 4 or Group 8 element impurities.

The isolation layer may also be on the surface of the highly resistive substrate in the peripheral area, and the trap-rich layer may be under the isolation layer in the peripheral area.

The peripheral area may not include the isolation layer, and the device may further comprise a step on a boundary between the well-forming area and the peripheral area.

In order to achieve the objectives of the present disclosure, the present disclosure also provides an RF switch device, including a highly resistive substrate having a well-forming area including an active device (e.g., an array of active devices) and a well, and a peripheral area; a gate electrode on the highly resistive substrate in the well-forming area; a source and a drain in the highly resistive substrate in the well-forming area; an isolation layer in or on a surface of the highly resistive substrate; a metal line on the highly resistive substrate in the peripheral area; and a trap-rich layer in or on the surface of the highly resistive substrate in the peripheral area. The peripheral area may include (i) a first area vertically overlapping the metal line and (ii) a second area.

The first area may not include the isolation layer, and the trap-rich layer may be on a side of the first area that does not include the isolation layer.

A width of the trap-rich layer may be substantially identical to (e.g., the same as) a width of the metal line.

The isolation layer may include a first isolation layer in the first area and a second isolation layer in the second area, and the first isolation layer and the trap-rich layer may alternate in at least one direction in the first area.

The first isolation layer may have a shape selected from a grid, a stripe, and an island.

In order to achieve the objectives of the present disclosure, the present disclosure also provides an RF switch device, including a highly resistive substrate having a well-forming area including an active device (e.g., an array of active devices) and a well, and a peripheral area including a first area that vertically overlaps a metal line and a second area; a gate electrode on the highly resistive substrate in the well-forming area; a source and a drain in the highly resistive substrate in the well-forming area; an isolation layer in or on a surface of the highly resistive substrate on a boundary between the well-forming area and the peripheral area and in the second area; the metal line, on the highly resistive substrate in the peripheral area; and a trap-rich layer in or on the surface of the highly resistive substrate under the metal line.

The isolation layer may include a plurality of isolation layers that are spaced apart from each other in at least one direction in the second area, and the trap-rich layer may be in a space separating the isolation layers in the second area.

The isolation layer in the second area may have a shape selected from a grid, a stripe, and an island.

The isolation layer may include a plurality of isolation layers that are spaced apart from each other in at least one direction in each of the first and second areas.

The isolation layer may have substantially the same shape in the first and second areas.

The trap-rich layer may be in the surface of the highly resistive substrate in the space separating the isolation layers in the first and second areas.

The trap-rich layer may comprise an area (e.g., of the highly resistive substrate) doped with argon or germanium impurities.

In order to achieve the objectives of the present disclosure, the present disclosure also provides a method of manufacturing an RF switch device, including forming an isolation layer on a boundary of a well-forming area and on a surface of a highly resistive substrate; forming an active device and a well in the well-forming area; and forming a plurality of first trap areas on the surface of the highly resistive substrate, and the isolation layer may include a plurality of isolation layers between adjacent first trap areas spaced apart from each other in at least one direction.

The method may further include forming a second trap area in a space separating the plurality of isolation layers between the first trap areas.

Each of the first and second trap areas may be formed by ion implanting Group 4 or Group 8 element impurities.

The present disclosure has the following effects.

One or more of the above-described configurations are advantageous in that a trap-rich layer is on a surface of a highly resistive substrate to trap one or more carriers on the surface of the substrate, thereby improving a PSC phenomenon.

Furthermore, the above-described configuration(s) are advantageous in that a trap-rich layer is in a highly resistive substrate without being between a BOX layer and the highly resistive substrate as in the related art, thus simplifying the manufacturing process and enhancing economic efficiency.

On the other hand, it is to be noted that other effects are expected from the technical features of the present disclosure, even if the effects are not explicitly mentioned in the following description.

BRIEF DESCRIPTION OF THE DRAWINGS

The above and other objectives, features, and other advantages of the present disclosure will be more clearly understood from the following detailed description when taken in conjunction with the accompanying drawings, in which:

FIG. 16 is a cross-sectional view of an RF switch device according to a fourth embodiment of the present disclosure.

FIGS. 17A to 17C are schematic plan views illustrating the shape of a first isolation layer in the RF switch device of FIG. 16.

DETAILED DESCRIPTION OF THE INVENTION

Hereinafter, embodiments of the present disclosure will be described in detail with reference to the accompanying drawings. The present disclosure may be embodied in many different forms and should not be construed as being limited to only the embodiments set forth herein. Rather, the embodiments are provided to make the disclosure thorough and complete and to sufficiently convey the spirit of the present disclosure to those skilled in the art.

In the present disclosure, the singular forms are intended to include the plural forms as well, unless the context clearly indicates otherwise. It will be further understood that the terms "comprise" and/or "comprising" when used in this specification specify the presence of stated features, integers, steps, operations, members, elements, and/or combinations of them but do not preclude the presence or addition of one or more other features, integers, steps, operations, members, elements, and/or combinations thereof.

Hereinafter, when one component (or layer) is described as being on another component (or layer), it should be noted that the one component may be directly on the other component, or one or more other component(s) or layer(s) may be interposed therebetween. Further, when one component is expressed as being directly on or over another component, other component(s) are not between the corresponding components. Furthermore, the terms on, above, under, on an upper side of, on a lower side of, on a side of, or on a side surface of, when used with regard to two or more components, refers to a relative positional relationship.

It will be understood that, although the terms "first", "second", "third", etc. may be used herein to describe various elements, areas and/or parts, they should not be limited by these terms.

Furthermore, it should be noted that a certain process may be performed in an order different from the order described below, where a specific embodiment may be otherwise implemented. For example, two processes described in succession may be performed substantially simultaneously or in reverse order, at least where the result is substantially the same.

In addition, conductive types or doping areas of components may be defined as a "P-type" or "N-type" according to characteristics of the main carrier. However, this is merely for convenience of description, and the technical spirit of the present disclosure is not limited to a specific description. For example, hereinafter, the terms "P-type" or "N-type" may be replaced with more general terms, such as a "first conductive type" or a "second conductive type". Here, the first conductive type may mean P-type, and the second conductive type may mean N-type.

Furthermore, it should be understood that "high concentration" and "low concentration" with respect to the concentration of a dopant or impurity refer to a relative doping concentration between one component and another component.

Figure 3:
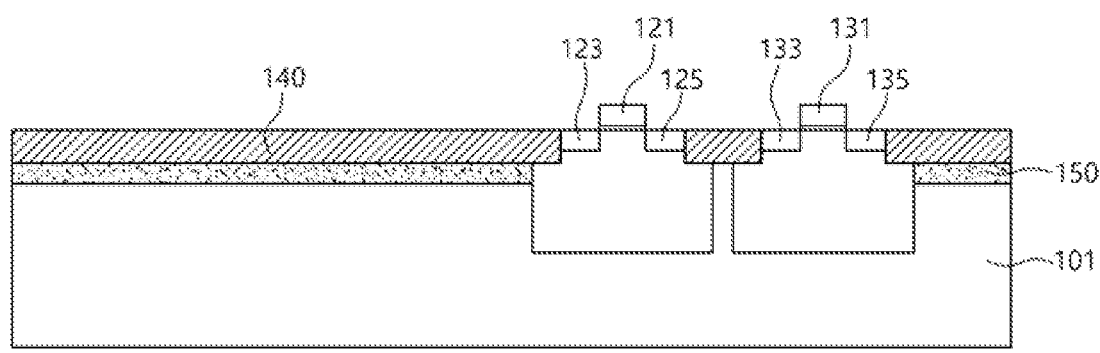
FIG. 3 is a cross-sectional view of an RF switch device according to a first embodiment of the present disclosure.
Figure 4:
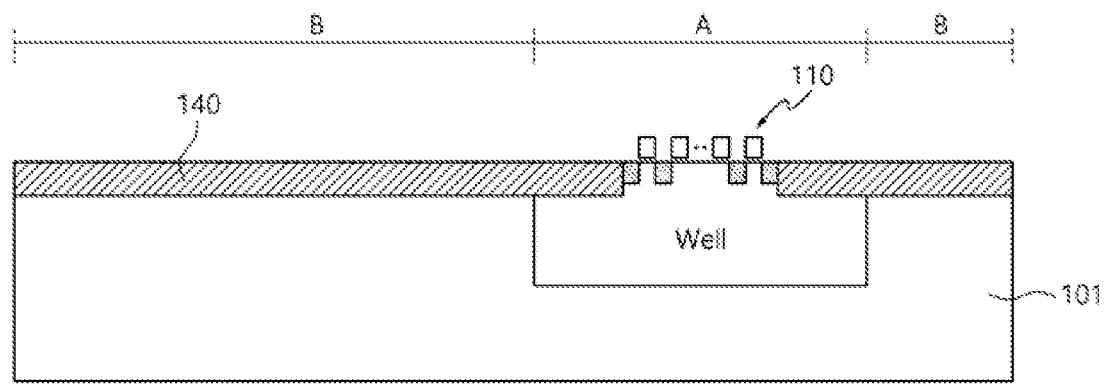
FIGS. 4 and 5 are cross-sectional views of a method of manufacturing the RF switch device according to the first embodiment of the present disclosure.
Figure 5:
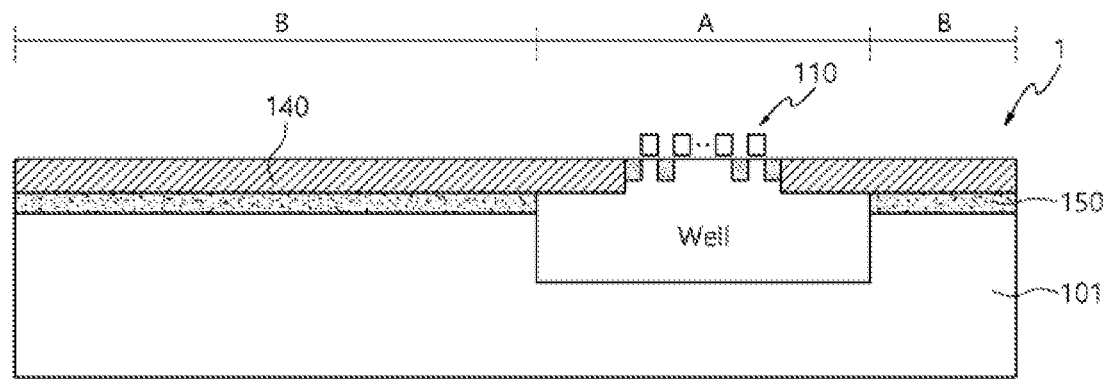

FIG. 3 is a cross-sectional view of an RF switch device according to a first embodiment of the present disclosure, and FIGS. 4 and 5 are cross-sectional views of a method of manufacturing the RF switch device according to the first embodiment of the present disclosure.

Hereinafter, the RF switch device 1 and the method of manufacturing the RF switch device according to the first embodiment of the present disclosure will be described in detail with reference to the accompanying drawings.

Referring to FIG. 3, the present disclosure relates to the RF switch device 1. More particularly, the present disclosure relates to the RF switch device 1 including a trap area in a surface of a highly resistive substrate 101 to trap one or more carriers on the surface of the substrate, thus improving RF characteristics.

First, referring to FIGS. 3 and 5, the highly resistive substrate 101 may be a silicon substrate, and may be doped at a low concentration with first conductive type impurities such as B or In or second conductive second impurities such as P or As. The resistance of the highly resistive substrate 101 is preferably approximately 1,000 ohm·cm or more, and more preferably 1,000 ohm·cm or more and 20,000 ohm·cm or less.

The switch device 1 may be partitioned into a well-forming area A including an active device (e.g., an array of active devices) and a well, and a peripheral area B. A field-effect transistor 110 may be formed in the well-forming area A. A plurality of field-effect transistors 110 may be formed in the well-forming area A. The transistor 110 may include a source, a drain, and a gate electrode on a surface of the substrate. For example, a plurality of gate electrodes may be on a surface of the substrate 101, and a second conductive type source 123 and drain 125 are formed on a surface of or in the substrate 101 having a first gate electrode 121 thereon. A first conductive type well may be formed in the substrate 101, and the source 123 and the drain 125 may be formed in the well.

Further, a first conductive type source 133 and a first conductive type drain 135 are formed in and/or on a surface of the substrate 101 having a second gate electrode 131 adjacent to the first gate electrode 121 thereon. Furthermore, a second conductive type well may be formed in the substrate 101, and the first conductive type source 133 and drain 135 may be formed therein. Although CMOS devices may be in the well-forming area A or on a side thereof, the scope of the present disclosure is not limited to the above examples.

Furthermore, an isolation layer 140 defining the active area may be formed on a boundary between the well-forming area A and the peripheral area B. The isolation layer 140 may be formed by performing a Shallow Trench Isolation (STI) process, and may comprise a silicon oxide (e.g., undoped silicon dioxide), for example. Thus, the isolation layer 140 may be formed on the surface of the substrate 101 in the peripheral area B. Furthermore, as shown in the drawing, the isolation layer 140 may extend from the boundary of the well-forming area A to a position where it partially overlaps the well-forming area A.

In the peripheral area B, a trap-rich layer 150 is formed in the substrate 101 under the isolation layer 140. Alternatively, the trap-rich layer 150 may be first formed in the substrate 101, and the isolation layer 140 may be formed thereon. The trap-rich layer 150 may be formed by ion implantation, and may be an area (e.g., of the highly resistive substrate) doped with Group 4 or Group 8 element impurities. The trap-rich layer 150 may be preferably formed by ion implantation of germanium (Ge) or argon (Ar), for example, but may also be formed by ion implantation of neon (Ne), krypton (Kr), or carbon (C).

Hereinafter, the structure and problem of the conventional RF switch substrate 9 will be described in detail.

Figure 1:
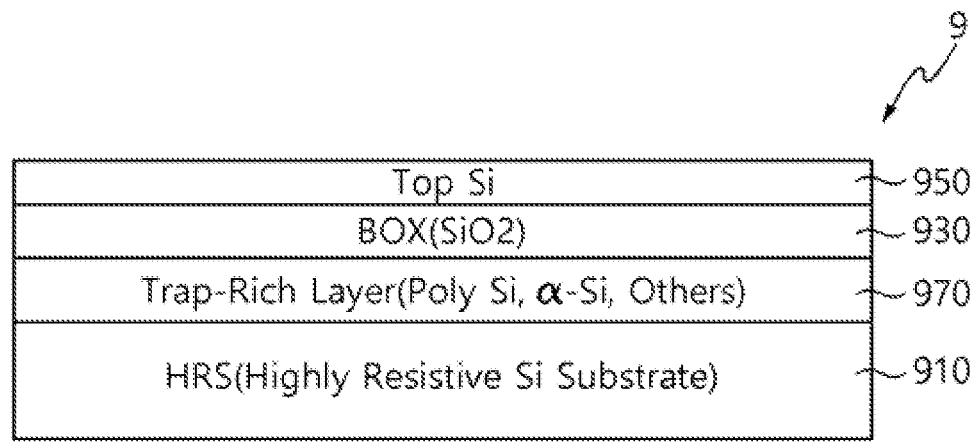
FIG. 1 is a reference diagram of a conventional RF switch device.

The conventional substrate 9 is described with reference to FIG. 1: a buried oxide (BOX) layer 930 is stacked on a highly resistive substrate (HRS) 910, and subsequently a top silicon (Si) layer 950 is stacked on the BOX layer 930. the silicon layer 950 is physically separated from the highly resistive substrate 910 by the BOX layer 930. However, radio frequency coupling may occur due to parasitic capacitance between the highly resistive substrate 910 and the silicon layer 950, so carriers may accumulate on a surface of the highly resistive substrate 910 facing the BOX layer 930. Thereby, the surface resistance of the highly resistive substrate 910 decreases. This is referred to as Parasitic Surface Conduction (PSC). Due to the PSC phenomenon, crosstalk may occur between adjacent metal lines (e.g., that are over the highly resistive substrate 910 and close enough to be capacitively coupled to the highly resistive substrate 910). Furthermore, the resistance level of the highly resistive substrate 910 may vary depending on an input radio frequency signal, that is, linearity may deteriorate.

In order to solve the problem, a structure for removing the PSC phenomenon by forming a trap-rich layer 970 between the BOX layer 930 and the highly resistive substrate 910 and then trapping the carriers that accumulate on the surface of the highly resistive substrate 910 is used. Thereby, improved RF characteristics may be obtained as compared to the conventional structure.

Figure 2:
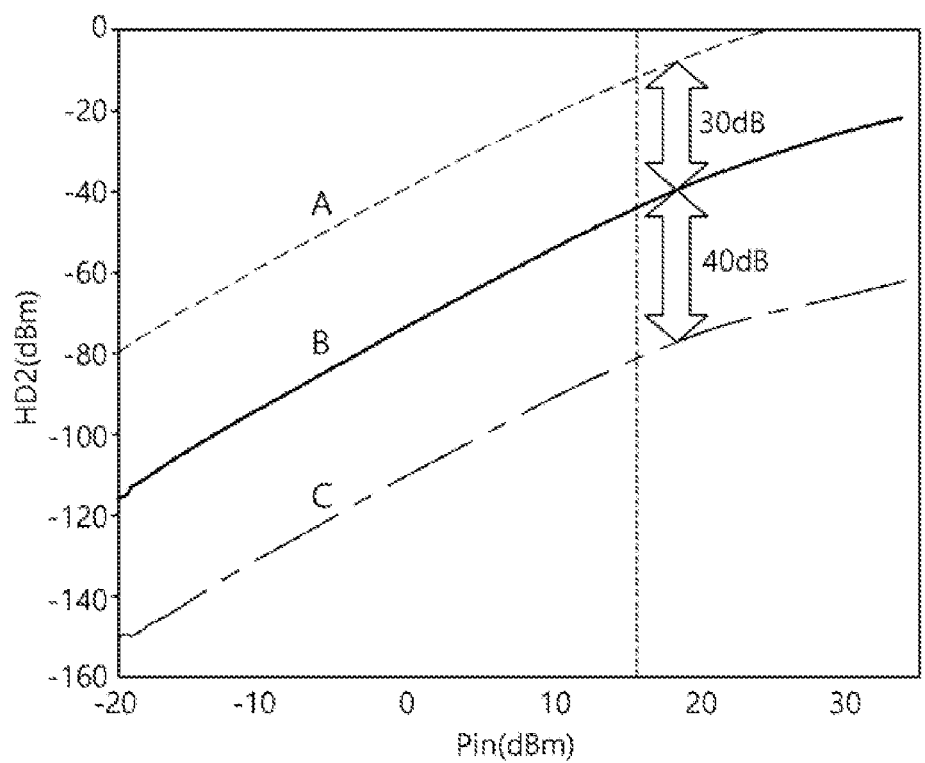
FIG. 2 is a graph comparing HD2 characteristics of a general SOI wafer, an SOI wafer using a highly resistive substrate, and an SOI wafer having a trap-rich layer on the highly resistive substrate.

Referring to FIG. 2, reference character A denotes second harmonic distortion (HD2) characteristics of a general SOI wafer which has a substrate resistance of 10 ohm·cm, reference character B denotes HD2 characteristics of an SOI wafer using the highly resistive substrate which has a substrate resistance of 1,000 ohm·cm, and reference character C denotes HD2 characteristics of an SOI wafer having the trap-rich layer 970 on the highly resistive substrate. Assuming that the input power is 15 dBm, it can be seen that the use of the highly resistive substrate 910 improves the HD2 characteristics by about 30 dB as compared to the general SOI wafer, and the use of the trap-rich layer 970 further improves the HD2 characteristics by about 40 dB.

However, the trap-rich layer 970 between the BOX layer 930 and the highly resistive substrate 910 is problematic, in that it is formed by a relatively complicated process, its manufacturing cost is high, and thereby its economic efficiency is relatively low.

In order to solve the problems, referring to FIGS. 3 and 5, the RF switch device 1 according to a first embodiment of the present disclosure forms the trap-rich layer 150 in the highly resistive substrate 101. The trap-rich layer 150 is under the isolation layer 140, in the peripheral area B outside the well-forming area A. Unlike the conventional structure, the trap-rich layer 150 is directly formed in the highly resistive substrate 101, and a separate BOX layer or the like is not present. This can simplify the manufacturing process. In other words, the trap-rich layer 150 is formed in the single highly resistive substrate 101, rather than a structure that includes multiple layers.

The method of manufacturing the RF switch device 1 according to the first embodiment will be described. Referring to FIG. 4, an isolation layer 140 is formed on the surface of the highly resistive substrate 101, and the transistors 110 and one or more wells (hereinafter, a plurality of wells may be represented by one well in the drawings) are formed in the well-forming area A. The transistors 110 and well(s) may be formed by conventional methods, and a detailed description thereof will be omitted. The isolation layer 140 may be formed on the surface of the substrate 101 in the peripheral area B and in the peripheral region(s) of the well-forming area A. Subsequently, referring to FIG. 5, the trap-rich layer 150 may be formed under the isolation layer 140 in the substrate 101 in the peripheral area B. For example, after a mask pattern (not shown) is formed on the substrate 101 to block a central part of the well-forming area A and leave the peripheral area B open or uncovered, the trap-rich layer 150 may be formed by ion implantation of one or more Group 4 or Group 8 elements.

Alternatively, the trap-rich layer 150 may be formed after forming the trench during the shallow trench isolation process, but before deposition of the isolation layer 140. In this alternative embodiment, the Group 4 and/or Group 8 impurity is implanted into the substrate 101 at a lower dose and a lower energy than when the trap-rich layer 150 is formed after completion of the shallow trench isolation process. In addition, annealing the isolation layer 140 after deposition of the isolation material (e.g., silicon dioxide) can also repair some or all of the damage to the substrate 101 resulting from the ion implantation process.

In any embodiment disclosed herein, the Group 4 and/or Group 8 impurity may be implanted into the substrate 101 at a dose of $10^{13}$-$10^{16}$ ions/cm$^2$ and an energy of 1-300 keV, or at any dose or range of doses and at any energy or range of energies within such ranges. Because Group 4 and Group 8 impurities do not change the conductivity type of the doped semiconductor structure into which they are implanted (e.g., the highly resistive substrate 101, the well, etc.), the Group 4 and/or Group 8 impurity may be implanted into the substrate 101 before or after forming the well. Also, in any embodiment disclosed herein, following ion implantation of the Group 4 and/or Group 8 impurity, the substrate may be annealed at a temperature of 500-1200° C. for a length of time of 5-300 seconds, or at any temperature or range of temperatures and for any length of time or range of lengths of time within such ranges.

Figure 6:
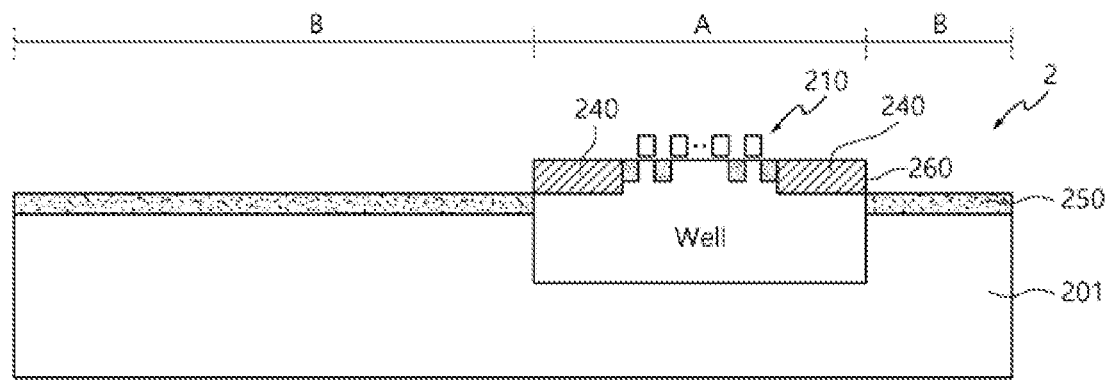
FIG. 6 is a cross-sectional view of an RF switch device according to a second embodiment of the present disclosure.
Figure 7:
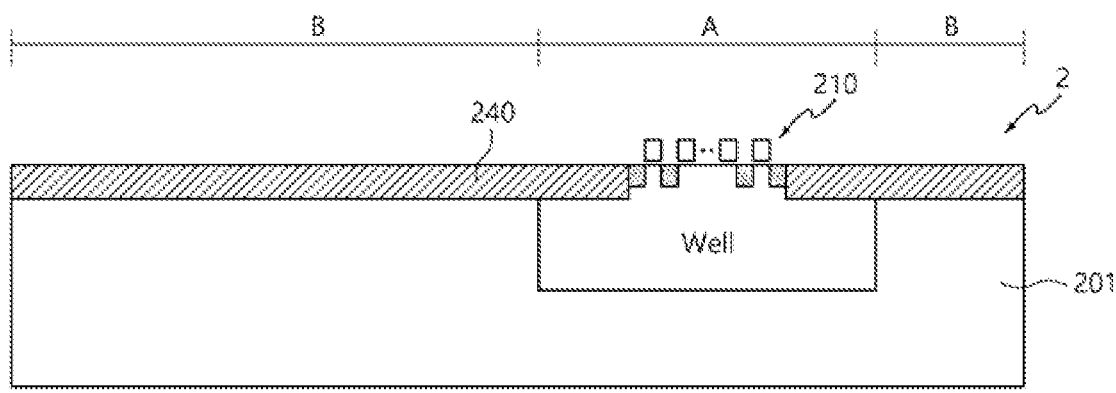
FIGS. 7 to 9 are cross-sectional views of a method of manufacturing the RF switch device according to the second embodiment of the present disclosure.
Figure 8:
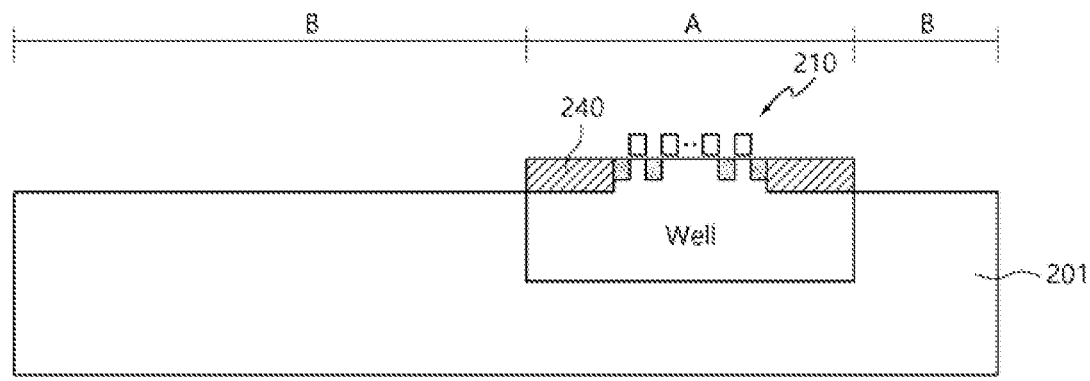
Figure 9:
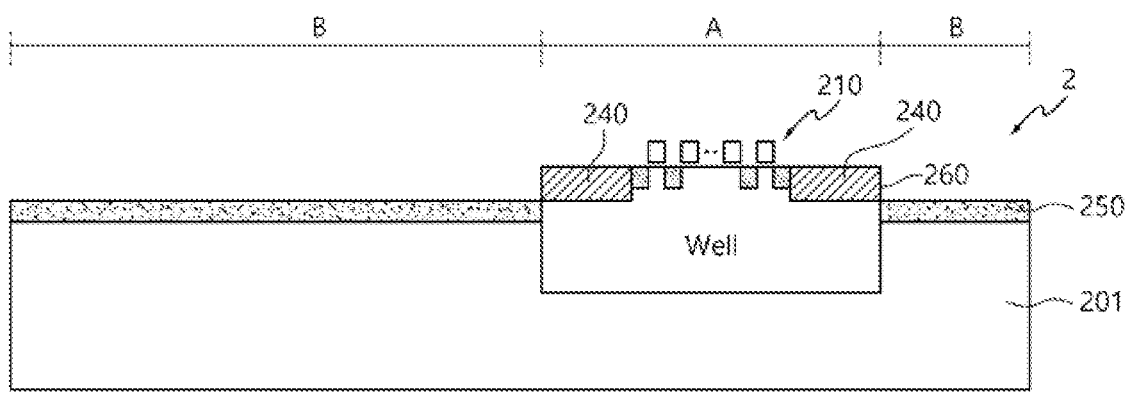

FIG. 6 is a cross-sectional view of an RF switch device according to a second embodiment of the present disclosure, and FIGS. 7 to 9 are cross-sectional views of a method of manufacturing the RF switch device according to the second embodiment of the present disclosure.

Hereinafter, the RF switch device 2 and the method of manufacturing the RF switch device according to the second embodiment of the present disclosure will be described in detail with reference to the accompanying drawings. Furthermore, a duplicated description of the first embodiment will be omitted.

Referring to FIG. 6, unlike the first embodiment, in the RF switch device 2 according to the second embodiment, the isolation layer 240 on the substrate 201 in the peripheral area B is removed. Thus, the isolation layer 240 as a device separator is only in the peripheral region(s) in the well-forming area A, and a step 260 is formed on the boundary between the well-forming area A and the peripheral area B. Furthermore, the trap-rich layer 250 is formed on and/or in the surface of the substrate 201 in the peripheral area B, but the isolation layer 240 and/or and the step 260 is not on the trap-rich layer 250.

The method of manufacturing the RF switch device 2 according to the second embodiment will be described. Referring to FIG. 7, as in the first embodiment, the isolation layer 240, the transistors 210, and the well(s) are formed. Thereafter, referring to FIG. 8, the isolation layer 240 in the peripheral area B is removed. For example, after a mask pattern (not shown) covering the well-forming area A and opening only the peripheral area B is formed on the surface of the substrate 201, and the isolation layer 240 in the peripheral area B is removed by etching. Thereafter, referring to FIG. 9, the trap-rich layer 250 is formed on the surface of the substrate 201 that is open in the peripheral area B through the mask. As in the first embodiment, the trap-rich layer 250 may be formed by ion implantation.

The device 2 according to the second embodiment may enhance manufacturing convenience as compared to the device 1 according to the first embodiment. Although the second embodiment etches the isolation layer 240 in the peripheral area B, the trap-rich layer 150 is formed through the isolation layer 140, and thereby the benefits of ion implantation directly into the substrate 201 may be obtained.

Figure 10:
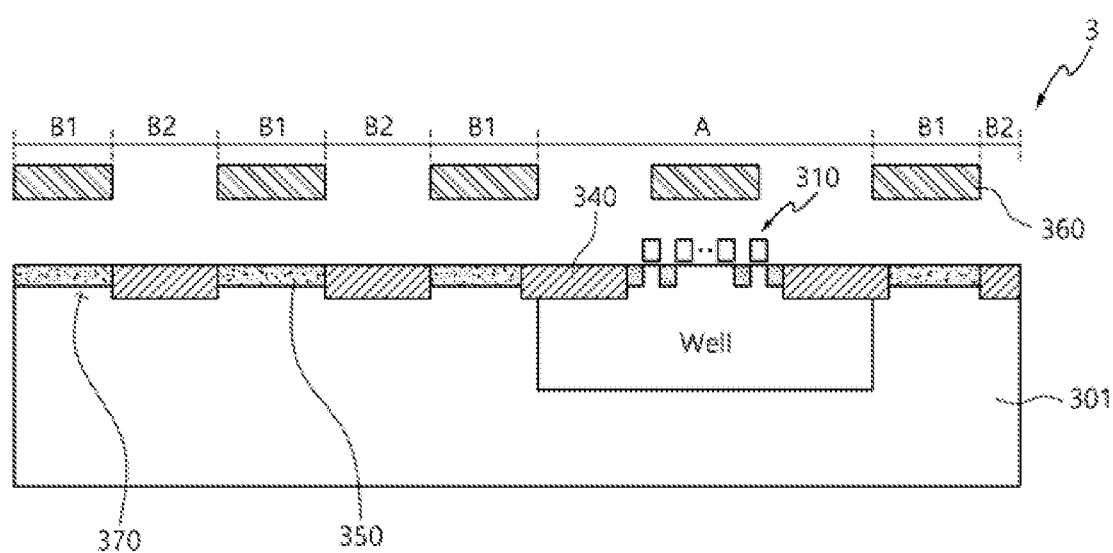
FIG. 10 is a cross-sectional view of an RF switch device according to a third embodiment of the present disclosure.
Figure 11A:
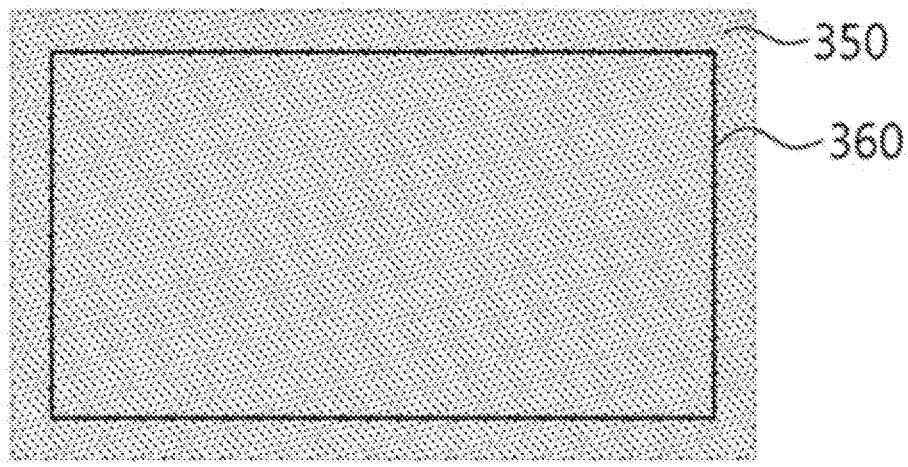
FIGS. 11A to 11C are schematic plan views illustrating the sizes of a metal line and a trap-rich layer in the RF switch device of FIG. 10.
Figure 11B:
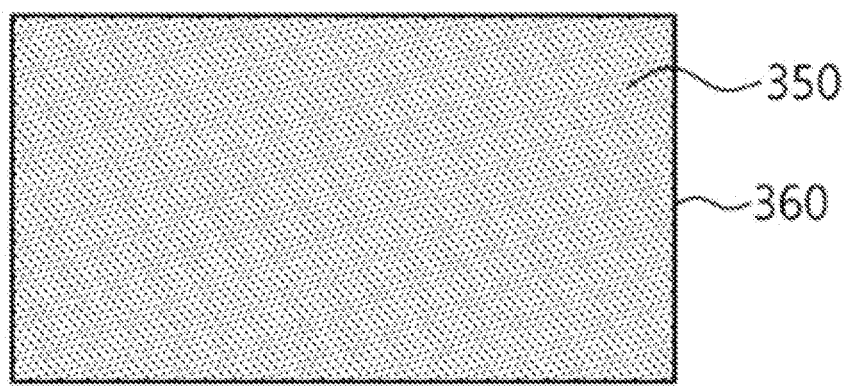
Figure 11C:
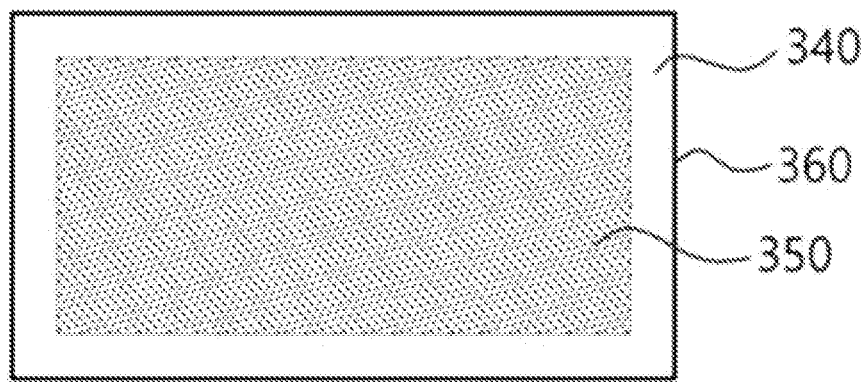

FIG. 10 is a cross-sectional view of an RF switch device according to a third embodiment of the present disclosure, FIGS. 11A to 11C are schematic plan views illustrating the sizes of a metal line and a trap-rich layer in the RF switch device of FIG. 10, and FIGS. 12 to 15 are cross-sectional views of a method of manufacturing the RF switch device according to the third embodiment of the present disclosure.

Hereinafter, the RF switch device 3 and the method of manufacturing the RF switch device according to the third embodiment of the present disclosure will be described in detail with reference to the accompanying drawings. Furthermore, a duplicated description of the preceding embodiments will be omitted.

Since the device 3 according to the third embodiment is different from the device 1 according to the first embodiment only in the structure of the peripheral area B, the peripheral area B will be mainly described.

Referring to FIG. 10, the peripheral area B may be classified into a first area B1 containing a metal line 360 in an insulating layer (not shown) above the substrate 301, and a second area B2 containing the insulating layer without the metal line 360. An isolation layer 340 is formed in or on a surface of the substrate 301 in the second area B2, but generally not in the first area B1, although one or more sidewalls of the metal line 360 may vertically overlap an isolation layer 340 at least partially. As such, the areas of the highly resistive substrate 301 in which the isolation layer 340 is not formed in the peripheral area B may also be referred to as a 'diffusion area 370'. Referring to FIGS. 11A to 11C, the width of the diffusion area 370 (which may be substantially equal to that of the trap-rich layer 350) may be slightly larger than, slightly smaller than, or equal to the width of the metal line 360 thereabove. However, the present disclosure is not limited thereto.

Referring to FIG. 10, the trap-rich layer 350 may be formed in the diffusion area 370. In other words, the trap-rich layers 350 are formed in spaces separating adjacent isolation layers 340, in the first areas B1. In such a structure, the isolation layers 340 and the trap-rich layers 350 may alternate with each other in the peripheral area B. In detail, the trap-rich layer 350 is formed in the first area B1, while the isolation layer 340 is formed in the second area B2. However, the sidewalls of the isolation layers 340 and the trap-rich layers 350 in the peripheral area B may not necessarily align with the sidewalls of the metal lines 360 thereabove (see FIGS. 11A to 11C).

The device 3 according to the third embodiment is different from the device 2 according to the second embodiment in that only part of the isolation layer(s) 340 in the peripheral area B are formed or removed. The device 2 according to the second embodiment may have the step 260 on the boundary between the well-forming area A and the peripheral area B, depending on the sequence of steps performed.

Steps such as in the second embodiment 2, may cause instability in structures formed on the substrate 201 in subsequent processes. In order to solve this problem, the device 3 according to the third embodiment forms or removes parts or portions of the device isolation layer 240 (see, e.g., FIG. 7) in the peripheral area B, and optionally, not at the boundary with the well-forming area A. In other words, the step may not be present at the boundary between the well-forming area A and the peripheral area B, near locations where overlying structures such as polysilicon gates and metal wires may be formed. Further, the structure of the third embodiment 3 in the peripheral area B may effectively remove the PSC phenomenon under the metal lines 360.

Figure 12:
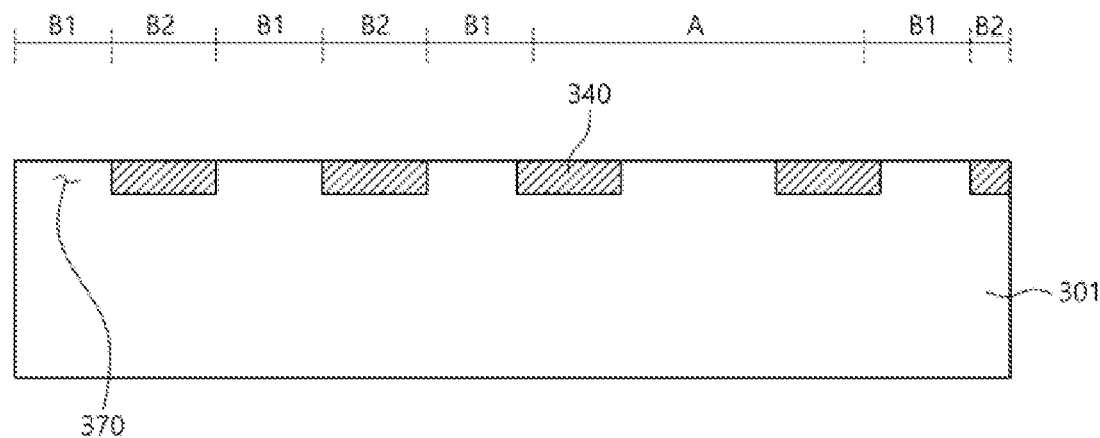
FIGS. 12 to 15 are cross-sectional views of a method of manufacturing the RF switch device according to the third embodiment of the present disclosure.

The method of manufacturing the RF switch device 3 according to the third embodiment will be described. Referring to FIG. 12, the isolation layers 340 are formed in and/or along the surface of the highly resistive substrate 301. As described above, the isolation layers 340 are formed in the second areas B2, in the peripheral region(s) of the well-forming area A, and on opposite sides of the boundary between the peripheral area B and the well forming area A, but not in the first areas B1 (or at least not in the center regions thereof). The diffusion areas 370 are formed in the first areas B1, but not in the second areas B2. The width of the diffusion area 370 may be substantially equal to, or slightly larger than or slightly smaller than, the width of the metal line 360 that is to be formed thereabove. However, the present disclosure is not limited thereto.

Figure 13:
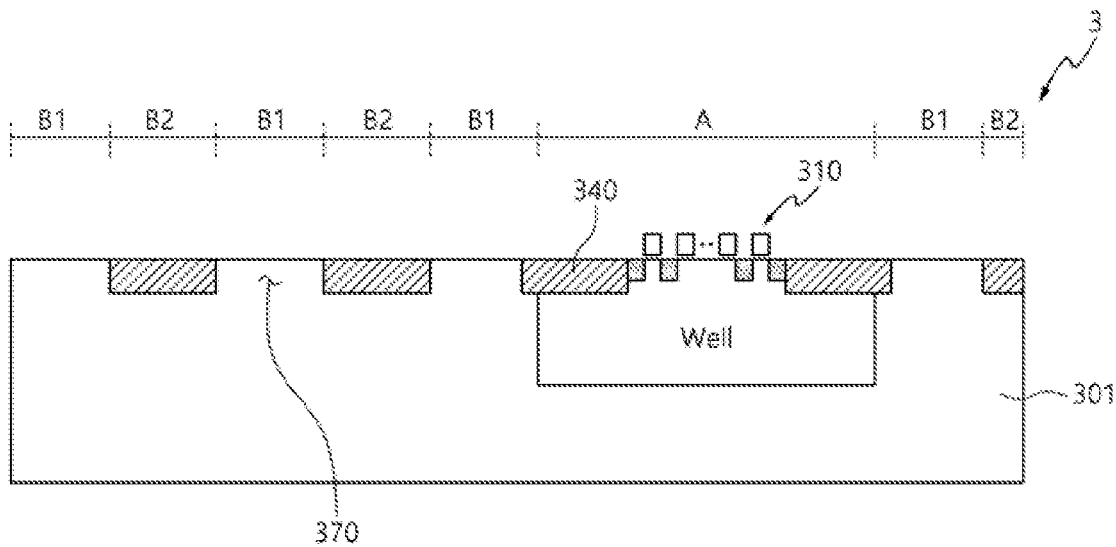
Figure 14:
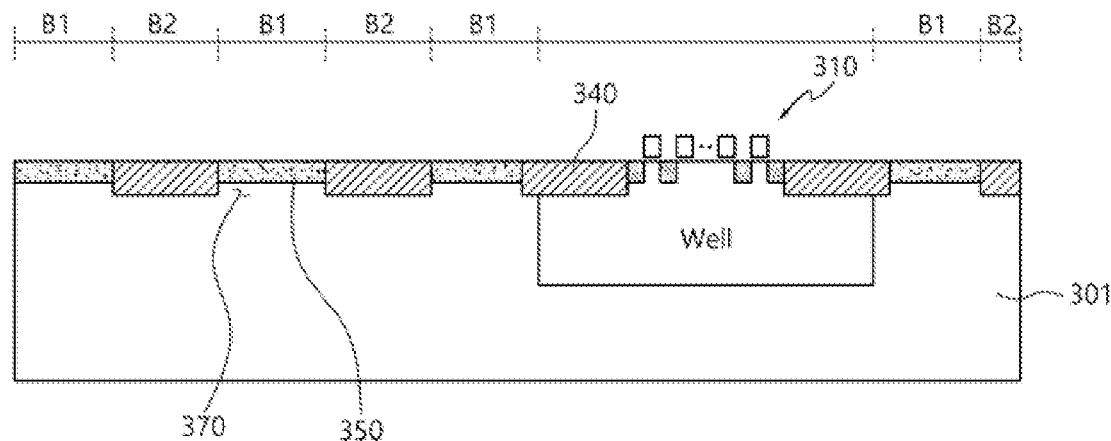
Figure 15:
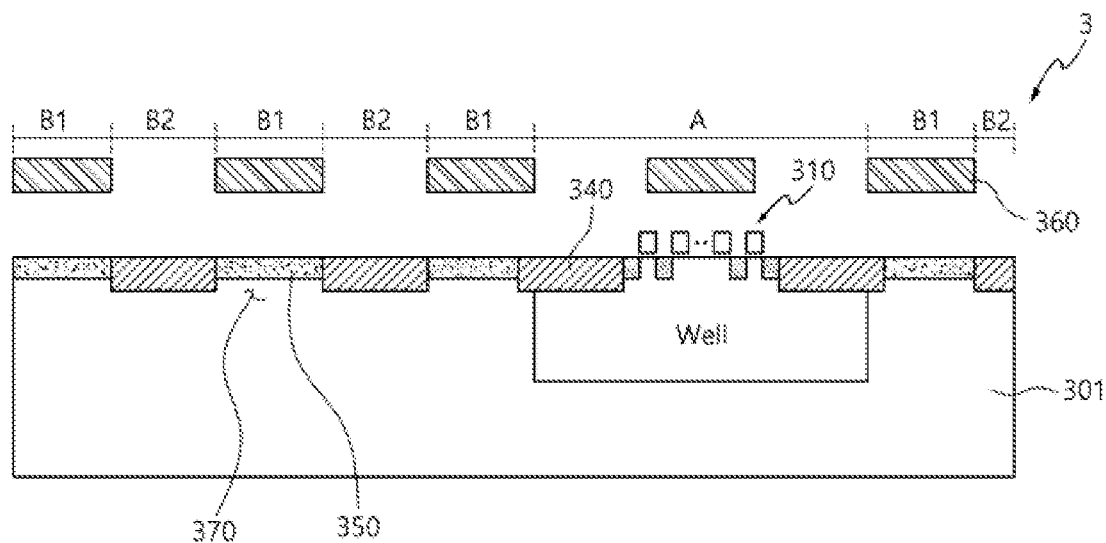

Subsequently, referring to FIG. 13, the transistors and the well(s) are formed in the well-forming area A. Thereafter, referring to FIG. 14, the trap-rich layer 350 is formed in the diffusion areas 370. The trap-rich layer 350 may be formed by ion implantation, as described herein. Subsequently, referring to FIG. 15, the metal lines 360 are formed in the well-forming areas A and the first areas B1 above the substrate 301 (e.g., on one or more insulating or dielectric layers). The metal lines 360 may be formed by blanket deposition of a metal layer on the insulating layer(s), then patterning and etching the metal layer. A detailed description thereof will be omitted herein. Thus, it is to be noted that the process of forming the metal line 360 is not performed immediately after the process of forming the trap-rich layer 350.

FIG. 16 is a cross-sectional view of an RF switch device according to a fourth embodiment of the present disclosure, FIGS. 17A to 17C are schematic plan views illustrating the shape of a first isolation layer in the RF switch device of FIG. 16, and FIGS. 18 to 21 are cross-sectional views of a method of manufacturing the RF switch device according to the fourth embodiment of the present disclosure.

Hereinafter, the RF switch device 4 and the method of manufacturing the RF switch device according to the fourth embodiment of the present disclosure will be described in detail with reference to the accompanying drawings. Furthermore, a duplicated description of the preceding embodiments will be omitted.

Since the device 4 according to the fourth embodiment is different from the device 3 according to the third embodiment only in the structure in the first area B1, the first area B1 will be mainly described.

Figure 21:
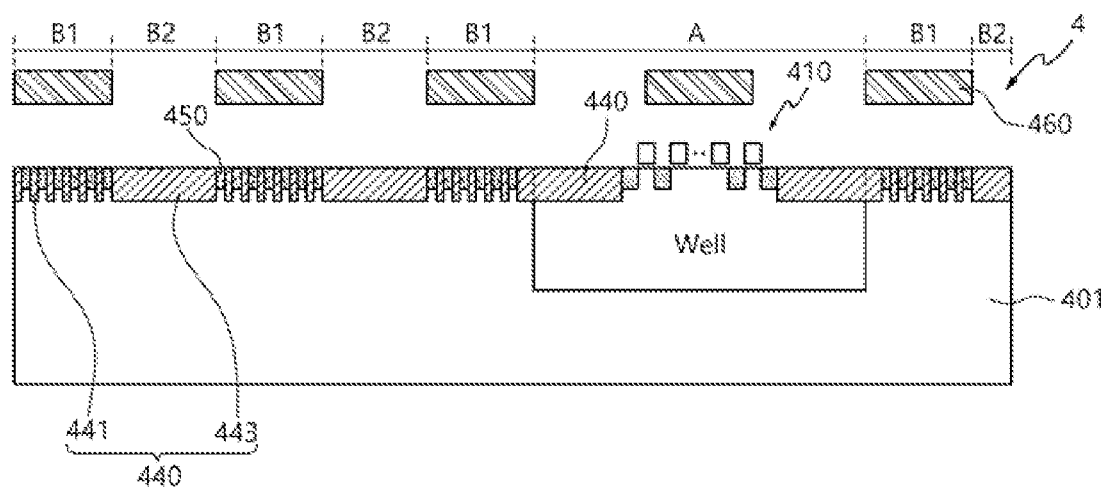

Referring to FIG. 16, in the first areas B1, diffusion areas 470 and first isolation layers 441 alternate along the surface of a substrate 401 under metal lines 460 (see, e.g., FIG. 21). In other words, trap-rich layers 450 are formed in spaces separating adjacent ones of the first isolation layers 441 in the first areas B1, and the first isolation layers 441 and the trap-rich layers 450 are formed in spaces separating adjacent second isolation layers 443 (e.g., in the second areas B2). Referring to FIGS. 17A to 17C, the first isolation layers 441 may be under the metal lines 460, and may have, for example, an island shape (FIG. 17A), a stripe shape (FIG. 17B), or a grid shape (FIG. 17C). However, the present disclosure is not limited thereto. Such configurations are advantageous when the first isolation layers 441 occupy part of the surface of the highly resistive substrate 401 under the metal lines 460.

Figure 18:
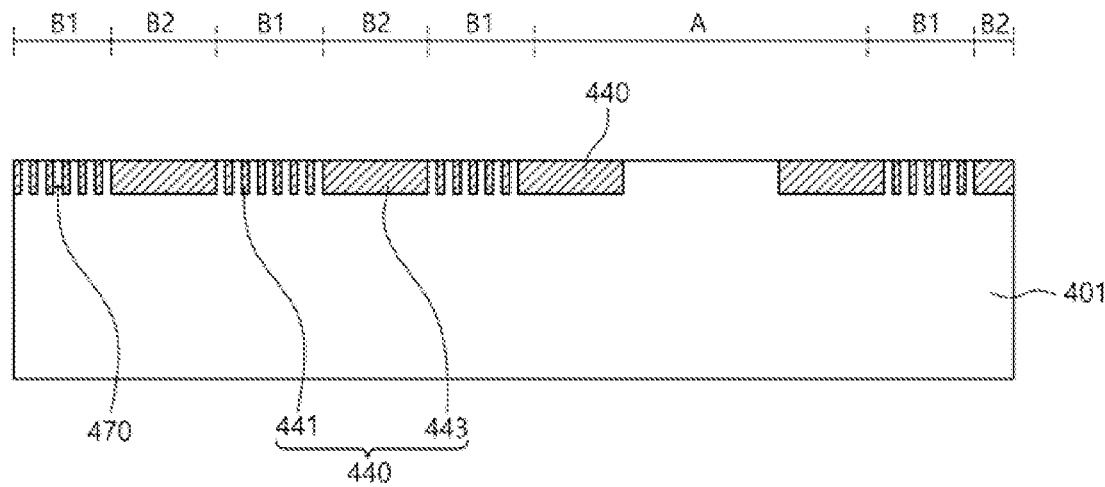
FIGS. 18 to 21 are cross-sectional views of a method of manufacturing the RF switch device according to the fourth embodiment of the present disclosure.
Figure 19:
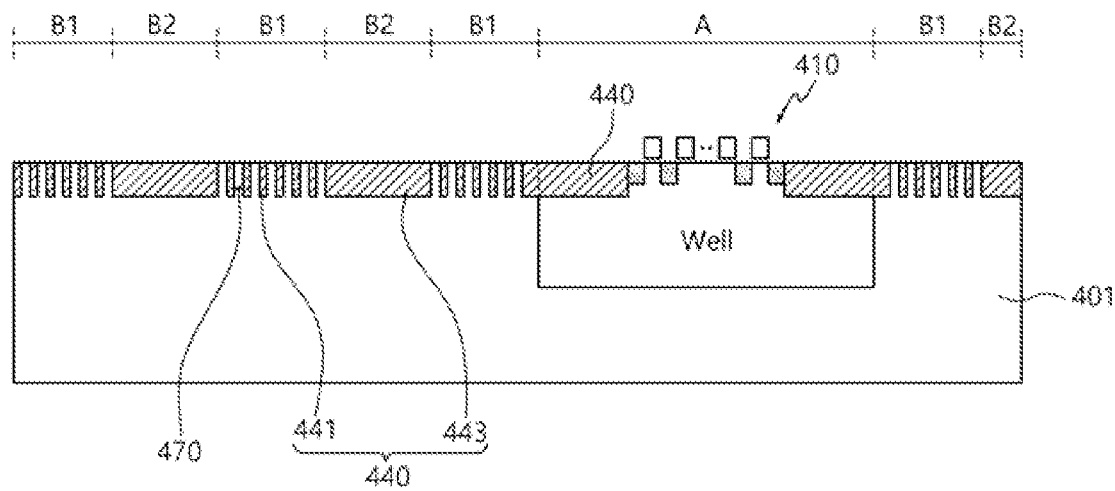
Figure 20:
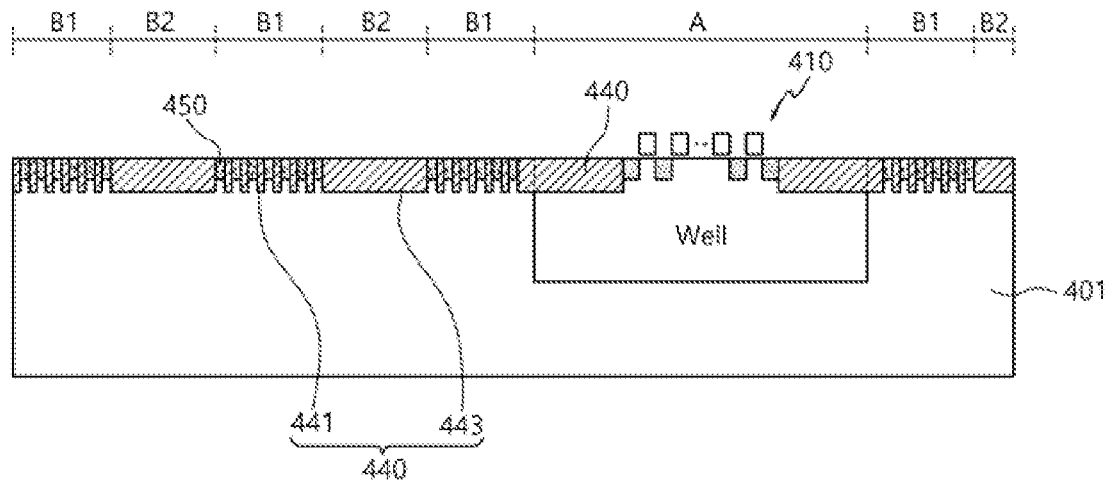

The manufacturing method thereof will be described. Referring to FIG. 18, first, isolation layers 440, including first isolation layers 441 and second isolation layers 443, are formed on a surface of the substrate 401. The plurality of first isolation layers 441 may have, for example, a grid shape, a stripe shape, or an island shape, such that they are (or have regions or portions) spaced apart from each other in one or more directions. Thereafter, referring to FIG. 19, transistors and well(s) are formed in the well-forming area A. Thereafter, referring to FIG. 20, trap-rich layers 450 are formed in spaces between first isolation layers 441 in the first areas B1 by ion implantation. Subsequently, referring to FIG. 21, one or more insulating layers (not shown) are formed on the substrate 401, and metal lines 460 may be formed on the insulating layer(s). As such, the trap-rich layers 450 and the first isolation layers 441 may alternate under the metal lines 460, thus more effectively removing the PSC phenomenon.

Figure 22:
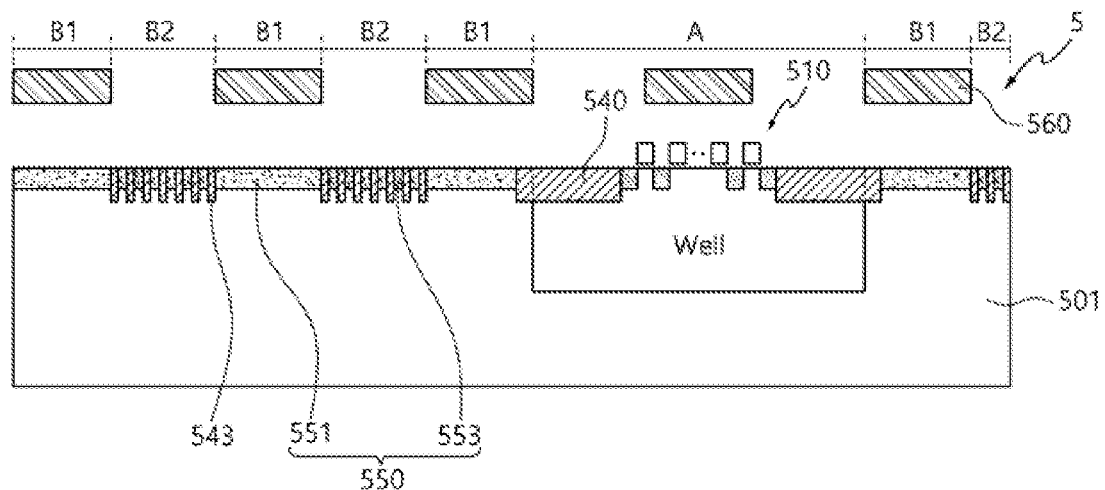
FIG. 22 is a cross-sectional view of an RF switch device according to a fifth embodiment of the present disclosure.

FIG. 22 is a cross-sectional view of an RF switch device according to a fifth embodiment of the present disclosure, and FIGS. 23 to 26 are cross-sectional views of a method of manufacturing the RF switch device according to the fifth embodiment of the present disclosure.

Hereinafter, the RF switch device 5 and the method of manufacturing the RF switch device according to the fifth embodiment of the present disclosure will be described in detail with reference to the accompanying drawings. Furthermore, a duplicated description of the preceding embodiments will be omitted.

Referring to FIG. 22, in the device 5 according to the fifth embodiment, isolation layers 543 may be formed in and/or on the surface of a substrate 501 in the second areas B2, and trap-rich layers 550 may be formed in both the first and second areas B1 and B2. The trap-rich layer in each first area B1 is referred to as a 'first trap layer 551'. The first trap layer 551 may have a width that is greater than, less than, or substantially the same as that of the metal line 560 thereabove. However, the present disclosure is not limited thereto.

Moreover, isolation layers 543 in the second areas B2 that do not contain the metal lines 560 are formed similarly or identically to the first isolation layers 441 of the fourth embodiment. Thus, in the second areas B2, the trap-rich layers 553 and the second isolation layers 543 may alternate, and the trap-rich layers 553 of each second area B2 are referred to as 'second trap layers 553'. As such, both the first trap layer 551 and the second trap layers 553 may be present, thus eliminating the PSC phenomenon occurring under the metal lines 560 as well as the PSC phenomenon that may occur in areas where the metal lines 560 are not formed.

Figure 23:
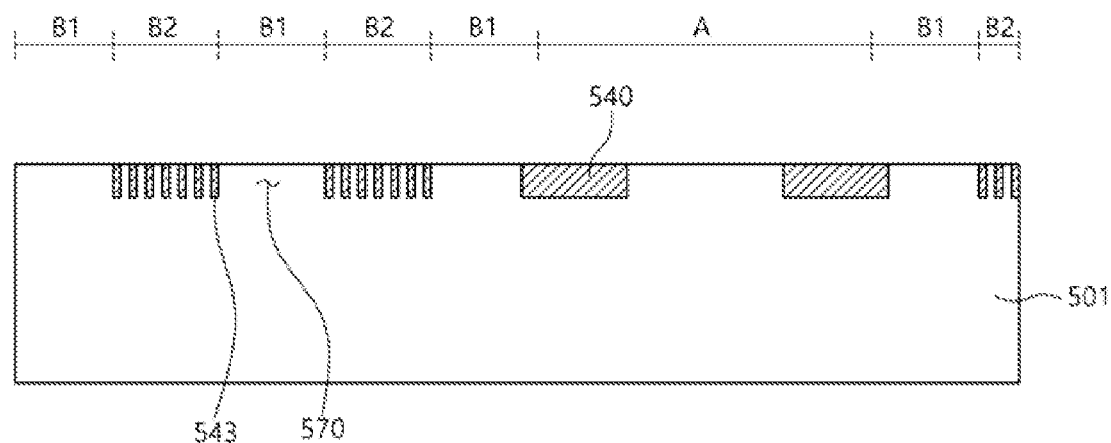
FIGS. 23 to 26 are cross-sectional views of a method of manufacturing the RF switch device according to the fifth embodiment of the present disclosure.

The device manufacturing method according to the fifth embodiment will be described. Referring to FIG. 23, first, isolation layers 540 and 543 are formed on and/or in the surface of the substrate 501. Isolation layers are not formed in the first areas B1. Thereafter, the surface of the substrate 501 is opened or uncovered (e.g., the mask used to form the isolation layers 540 and 543 is removed). Thereafter, a diffusion area 570 may be formed in the first and second areas B1 and B2 (e.g., by blanket ion implantation). The diffusion area 570 in the first areas B1 may have a size or width that is substantially equal to, larger or smaller than that of a metal line 560 that is to be formed later. However, the present disclosure is not limited thereto. In each second area B2, the diffusion areas 570 may be formed between the second isolation layers 543. The second isolation layers 543 in the second areas B2 may have, for example, a grid shape, a stripe shape or an island shape. However, the present disclosure is not limited thereto.

Figure 24:
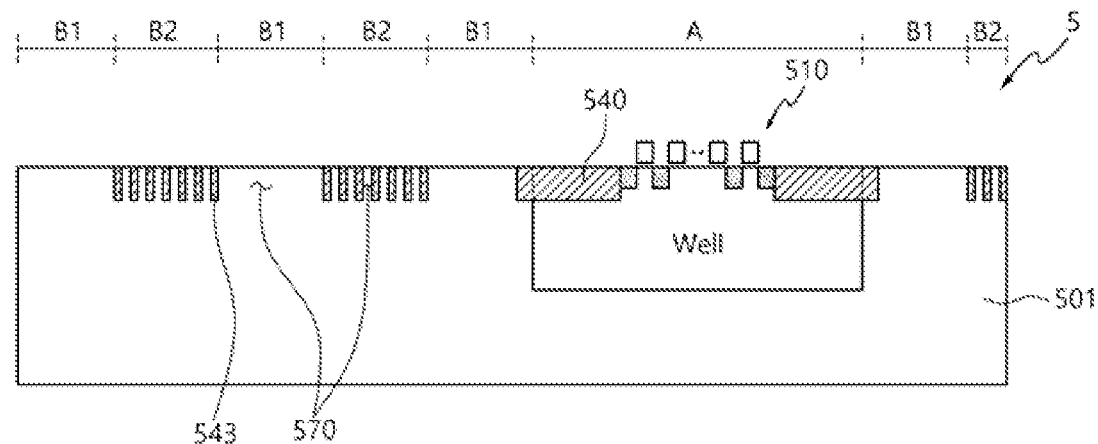
Figure 25:
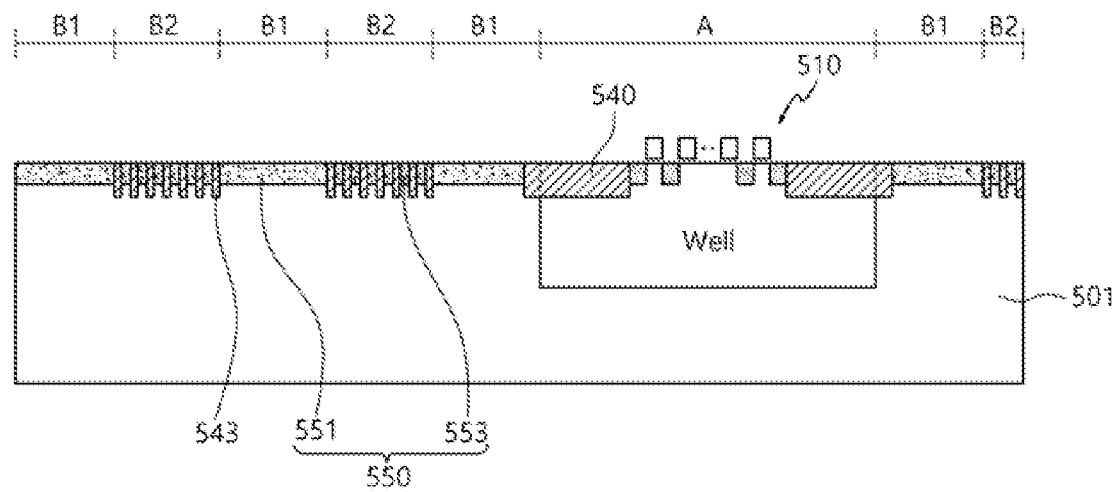
Figure 26:
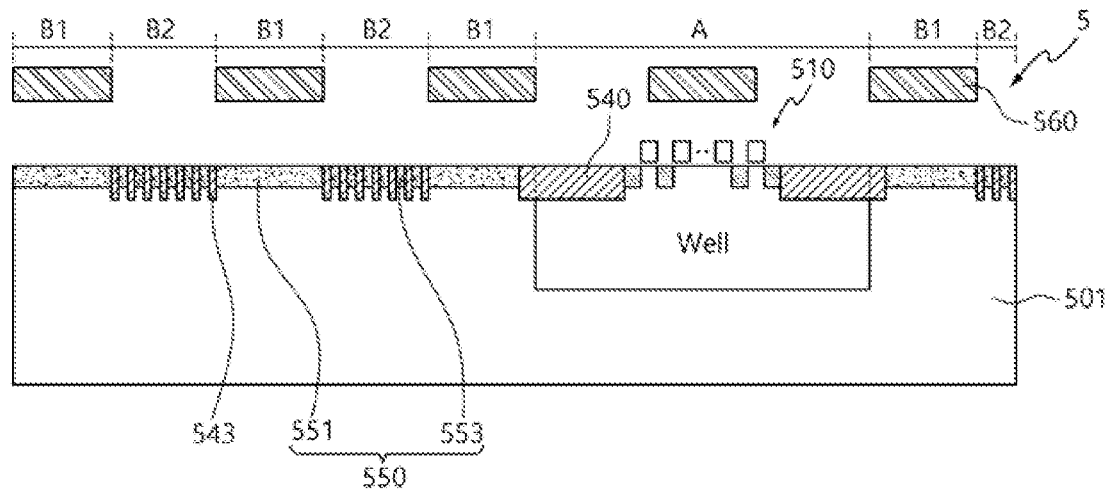

Thereafter, referring to FIG. 24, active devices (e.g., transistors) and well(s) are formed in the well-forming area A. Subsequently, referring to FIG. 25, trap-rich layers 550 are formed in diffusion areas 570 in the first and second areas B1 and B2. The trap-rich layers 550 may be formed by ion implantation, using a mask to block or cover the well-forming area A. Subsequently, referring to FIG. 26, one or more insulating layers (not shown) are formed on the substrate 501, and the metal lines 560 are formed on the insulating layer(s) in the well-forming area A and the first areas B1.

Figure 27:
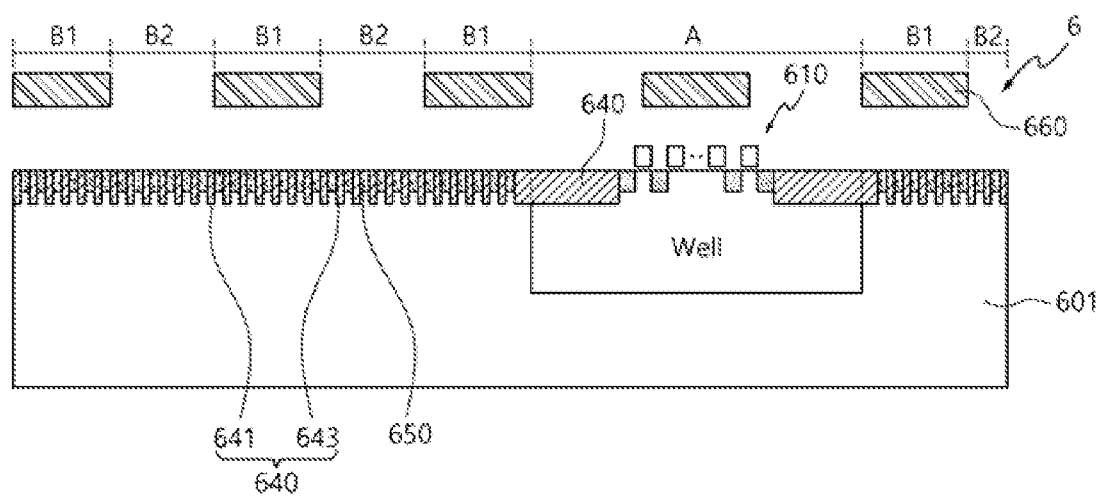
FIG. 27 is a cross-sectional view of an RF switch device according to a sixth embodiment of the present disclosure.

FIG. 27 is a cross-sectional view of an RF switch device according to a sixth embodiment of the present disclosure, and FIGS. 28 to 31 are cross-sectional views of a method of manufacturing the RF switch device according to the sixth embodiment of the present disclosure.

Hereinafter, the RF switch device 6 and the method of manufacturing the RF switch device according to the sixth embodiment of the present disclosure will be described in detail with reference to the accompanying drawings. Furthermore, a duplicated description of the preceding embodiments will be omitted.

Referring to FIG. 27, in the device 6 according to the sixth embodiment, isolation layers 640 and trap-rich layers 650 may alternate in both the first and second areas B1 and B2. Here, the isolation layers 640 may have, for example, a grid shape, a stripe shape or an island shape. However, the present disclosure is not limited thereto. Such a shape may effectively eliminate both the PSC phenomenon under the metal lines 660 and in areas where the metal lines 660 are not present.

Figure 28:
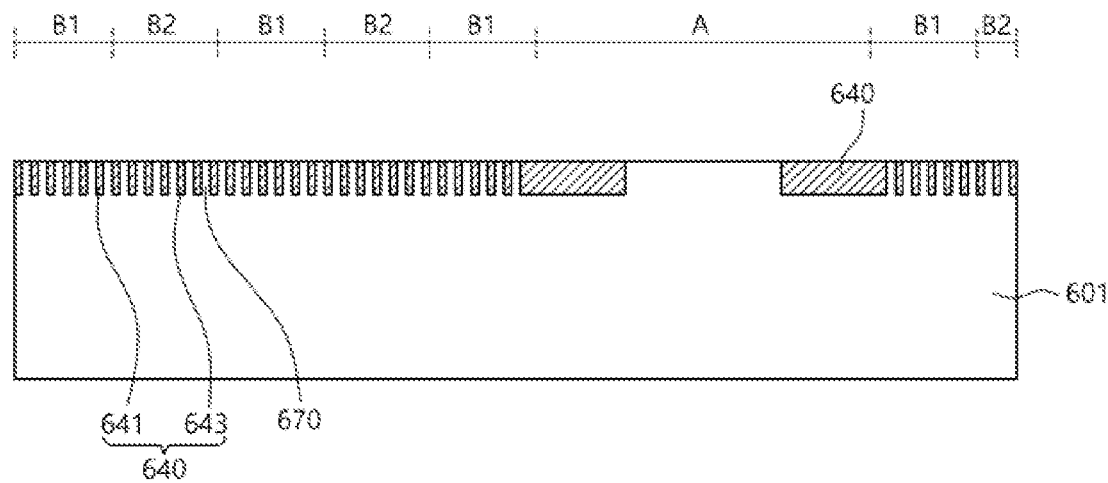
FIGS. 28 to 31 are cross-sectional views of a method of manufacturing the RF switch device according to the sixth embodiment of the present disclosure.

Furthermore, the manufacturing method will be described. First, referring to FIG. 28, isolation layers 640, including isolation layers 641 and 643, are formed on and/or in the surface of a highly resistive substrate 601. Since the isolation layers 640 in the first and second areas B1 and B2 occupy part of the surface of the highly resistive substrate 601, diffusion areas 670 are formed throughout or across the peripheral area B. The isolation layers 640 in the first and second areas B1 and B2 may have, for example, a grid shape, a stripe shape or an island shape. However, the present disclosure is not limited thereto. This allows the isolation layers 640 and the diffusion areas 670 to alternate in the peripheral area B. Preferably, the first isolation layers 641 and the second isolation layers 643 have substantially the same shape, but the present disclosure is not limited thereto.

Figure 29:
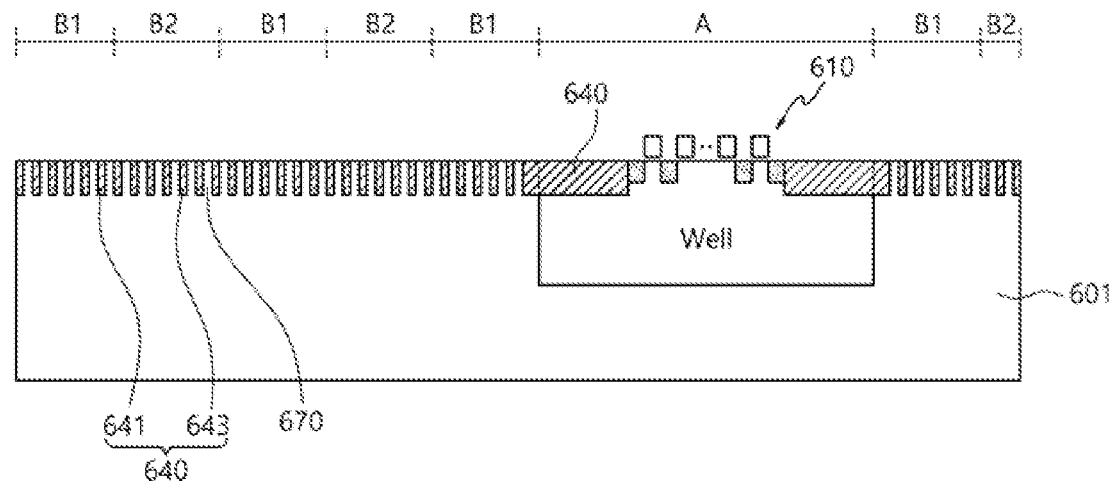
Figure 30:
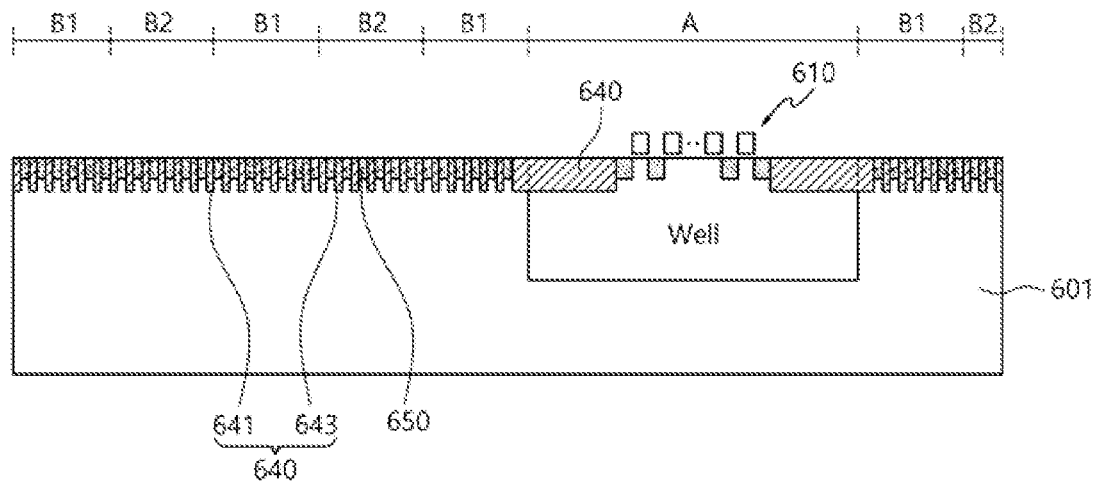
Figure 31:
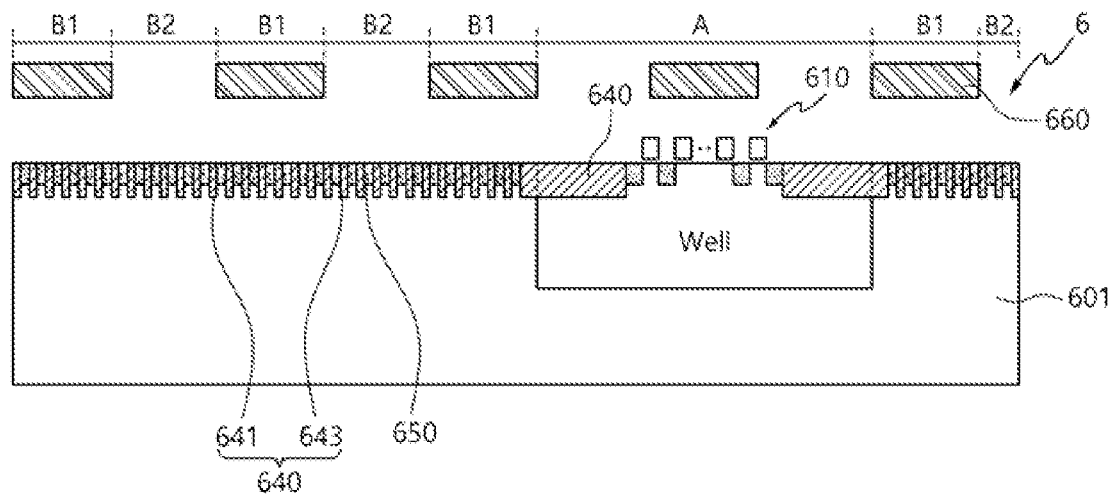

Thereafter, referring to FIG. 29, active devices and well(s) are formed in the well-forming area A. Subsequently, referring to FIG. 30, a trap-rich layer 650 is formed in the diffusion areas 670. The trap-rich layer 650 may be formed by ion implantation, as described herein. Subsequently, referring to FIG. 31, the insulating layer(s) (not shown) and the metal lines 660 are formed on the substrate 601.

Although the present disclosure was described with reference to specific embodiments shown in the drawings, it is apparent to those skilled in the art that the present disclosure may be changed and modified in various ways without departing from the scope of the present disclosure, which is described in the following claims.

What is claimed is:

1. An RF switch device, comprising:
   a highly resistive substrate having a well-forming area including an active device and a well, and a peripheral area;
   a gate electrode on the highly resistive substrate in the well-forming area;
   a source and a drain in the highly resistive substrate in the well-forming area;
   an isolation layer in or on a surface of the highly resistive substrate;
   a metal line on the highly resistive substrate in the peripheral area; and
   a trap-rich layer in or on the surface of the highly resistive substrate in the peripheral area,
   wherein the peripheral area comprises a first area vertically overlapping the metal line, and a second area, the first area does not include the isolation layer, and the trap-rich layer is on a side of the first area that does not include the isolation layer.

2. The RF switch device of claim 1, wherein a width of the trap-rich layer is substantially identical to a width of the metal line thereabove.

3. The RF switch device of claim 1, wherein the isolation layer comprises a first isolation layer in the first area and a second isolation layer in the second area, and
   the first isolation layer and the trap-rich layer alternate in at least one direction in the first area.

4. The RF switch device of claim 3, wherein the first isolation layer has a shape selected from a grid, a stripe, and an island.

5. An RF switch device, comprising:
   a highly resistive substrate having a well-forming area including an active device and a well, and a peripheral area including a first area that vertically overlaps a metal line and a second area;
   a gate electrode on the highly resistive substrate in the well-forming area;
   a source and a drain provided inside the highly resistive substrate in the well-forming area;
   an isolation layer in or on a surface of the highly resistive substrate on a boundary between the well-forming area and the peripheral area and in the second area, wherein the isolation layer comprises a plurality of isolation layers that are spaced apart from each other in at least one direction in the second area, and;
   the metal line, on the highly resistive substrate in the peripheral area; and
   a trap-rich layer in or on the surface of the highly resistive substrate under the metal line, wherein the trap-rich layer is in a space separating the isolation layers in the second area.

6. The RF switch device of claim 5, wherein the isolation layer in the second area has a shape selected from a grid, a stripe, and an island.

7. The RF switch device of claim 5, wherein the isolation layer comprises a plurality of isolation layers that are spaced apart from each other in at least one direction in each of the first and second areas.

8. The RF switch device of claim 7, wherein the isolation layer has substantially a same shape in the first and second areas.

9. The RF switch device of claim 7, wherein the trap-rich layer is in the surface of the highly resistive substrate in the space separating the isolation layers in the first and second areas.

10. The RF switch device of claim 9, wherein the trap-rich layer comprises an area doped with argon or germanium impurities.

11. An RF switch device, comprising:
    a highly resistive substrate having a well-forming area including an active device and a well, and a peripheral area;
    a gate electrode on the highly resistive substrate in the well-forming area;
    a source and a drain in the highly resistive substrate in the well-forming area;
    an isolation layer in or on a surface of the highly resistive substrate;
    a metal line on the highly resistive substrate in the peripheral area; and
    a trap-rich layer in or on the surface of the highly resistive substrate in the peripheral area,
    wherein the peripheral area comprises (i) a first area vertically overlapping the metal line and (ii) a second area, the isolation layer comprises a first isolation layer in the first area and a second isolation layer in the second area, and the first isolation layer and the trap-rich layer alternate in at least one direction in the first area.

12. The RF switch device of claim 11, wherein the first isolation layer has a shape selected from a grid, a stripe, and an island.

13. An RF switch device, comprising:
    a highly resistive substrate having a well-forming area including an active device and a well, and a peripheral area including a first area that vertically overlaps a metal line and a second area;
    a gate electrode on the highly resistive substrate in the well-forming area;
    a source and a drain provided inside the highly resistive substrate in the well-forming area;
    an isolation layer in or on a surface of the highly resistive substrate on a boundary between the well-forming area and the peripheral area and in the second area, wherein the isolation layer comprises a plurality of isoplation layers that are spaced apart from each other in at least one direction in each of the first and second areas;
    the metal line, on the highly resistive substrate in the peripheral area; and
    a trap-rich layer in or on the surface of the highly resistive substrate under the metal line.

14. The RF switch device of claim 13, wherein the isolation layer has substantially a same shape in the first and second areas.

15. The RF switch device of claim 13, wherein the trap-rich layer is in the surface of the highly resistive substrate in the space separating the isolation layers in the first and second areas.

16. The RF switch device of claim 13, wherein the trap-rich layer comprises an area doped with argon or germanium impurities.

* * * * *